US012224657B2

(12) United States Patent
Miki et al.

(10) Patent No.: US 12,224,657 B2
(45) Date of Patent: Feb. 11, 2025

(54) POWER CONVERTING DEVICE

(71) Applicant: Mitsubishi Electric Corporation, Tokyo (JP)

(72) Inventors: Takayoshi Miki, Tokyo (JP); Kohei Onda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 239 days.

(21) Appl. No.: 17/996,536

(22) PCT Filed: Jun. 17, 2020

(86) PCT No.: PCT/JP2020/023727
§ 371 (c)(1),
(2) Date: Oct. 19, 2022

(87) PCT Pub. No.: WO2021/255850
PCT Pub. Date: Dec. 23, 2021

(65) Prior Publication Data
US 2023/0223834 A1  Jul. 13, 2023

(51) Int. Cl.
*H02M 7/5395* (2006.01)
*H02M 1/088* (2006.01)
*H03K 17/687* (2006.01)

(52) U.S. Cl.
CPC ......... *H02M 1/088* (2013.01); *H02M 7/5395* (2013.01); *H03K 17/6871* (2013.01)

(58) Field of Classification Search
CPC ....... H03K 19/00346; H03K 19/00353; H03K 19/00361; H03K 19/003; H03K 19/00307;
(Continued)

(56) References Cited

U.S. PATENT DOCUMENTS 9,673,809 B1 * 6/2017 Kandah ................ H03K 17/691

FOREIGN PATENT DOCUMENTS

| JP | H06121544 A | 4/1994 |
| JP | 2000295860 A | 10/2000 |
| WO | 2007059985 A1 | 5/2007 |

OTHER PUBLICATIONS

International Search Report (PCT/ISA/210) with English translation and Written Opinion (PCT/ISA/237) mailed on Sep. 1, 2020, by the Japan Patent Office as the International Searching Authority for International Application No. PCT/JP 2020/023727.
(Continued)

*Primary Examiner* — Bryan R Perez
(74) *Attorney, Agent, or Firm* — BUCHANAN, INGERSOLL & ROONEY PC

(57) ABSTRACT

A power converting device includes upper-arm and lower-arm gate drive circuits which respectively drive upper-arm and lower-arm semiconductor switching elements and which respectively include upper-arm and lower-arm time point detection circuits for detecting time points at which voltages between main terminals of the upper-arm and lower-arm semiconductor switching elements have crossed respective reference voltages, and a controller including a calculator which calculates a change time point of an inverter output voltage and a PWM command pulse generator which generates, on the basis of information about the time point calculated by the calculator, a PWM command pulse to be given to the upper-arm gate drive circuit and the lower-arm gate drive circuit.

12 Claims, 6 Drawing Sheets

(58) Field of Classification Search
CPC ........... H03K 19/00315; H03K 17/161; H03K 17/302; H03K 17/56; H03K 17/567; H03K 17/60; H03K 17/687; H03K 17/6871; H03K 17/16; H03K 17/30; H03K 17/601; H03K 17/64; H03K 17/691; H03K 17/731; H03K 17/10; H03K 17/102; H03K 17/107; H03K 17/12; H03K 17/122; H03K 17/127; G11B 5/02; G11B 5/022
See application file for complete search history.

(56) References Cited

OTHER PUBLICATIONS

Office Action issued in corresponding Indian Patent Application No. 202227065206, mailed on Feb. 8, 2023, 5 pages.

\* cited by examiner

POWER CONVERTING DEVICE

TECHNICAL FIELD

The present disclosure relates to a power converting device.

BACKGROUND ART

An inverter is one type of power converting device. The input of the inverter is DC voltage, and the output of the inverter is AC voltage. Technologies in which an induction electric motor is driven to be rotated by using a two-level three-phase inverter, have been widely known. The two-level three-phase inverter receives a PWM command pulse generated by a controller and outputs two levels of voltages. However, a time point at which the output voltage of the inverter is changed differs from a corresponding time point at which the PWM command pulse is changed. If the difference is large, problems might arise in that: irregularity in rotation of the induction electric motor occurs; or electromagnetic noise increases. That is, although the inverter generates an AC waveform (sine wave), a deviation (harmonic) from an ideal sine wave leads to occurrence of irregularity in rotation or increase in noise. Basically, a command is given so as to generate a waveform similar to the sine wave by correcting the difference between the command and the output. However, a difference generated by incomplete correction leads to a deviation from the sine wave.

One of causes of the difference is a dead time that is set in order to prevent upper-arm and lower-arm semiconductor switching elements of the inverter from being simultaneously turned on. Another cause of the difference is presence of delay time of operations of respective components or a variation among the delay time.

There is a technology of Patent Document 1 as a technology for solving the above problems. In Patent Document 1, a voltage detection circuit is connected to an output portion of an inverter. In addition, a voltage division resistor is connected to DC input portion of the inverter, and a comparison reference voltage is generated. The comparison reference voltage is approximately ½ of the DC input voltage of the inverter. The voltage detection circuit detects, by using the comparison reference voltage, a time point at which the output voltage of the inverter has been changed. Further, the controller receives the result of the detection of the time point from the voltage detection circuit and compensates for a dead time.

In addition, there is a technology of Patent Document 2 as another technology. In Patent Document 2, an upper-arm ON detection circuit and a lower-arm ON detection circuit for respectively detecting ON states (5 V to 10 V) of upper-arm semiconductor switching elements and lower-arm semiconductor switching elements are connected to an output portion of an inverter. If the output voltage of the inverter is changed, the upper-arm ON detection circuit and the lower-arm ON detection circuit respectively transmit detection pulses. A controller calculates a time period that is ½ of the difference in time point between the two detection pulses. The controller obtains, on the basis of the result of the calculation, a change time point corresponding to a change time point of the output voltage of the inverter on the basis of the standard of ½ of the DC input voltage of the inverter. The controller compensates for a dead time on the basis of the change time point obtained by the calculation.

CITATION LIST

Patent Document

Patent Document 1: Japanese Laid-Open Patent Publication No. 1994-121544
Patent Document 2: Japanese Laid-Open Patent Publication No. 2000-295860

SUMMARY OF THE INVENTION

Problems to be Solved by the Invention

In the technology described in the above Patent Document 1, components are attached to both the output portion of the inverter and the input portion of the inverter. Consequently, the power converting device has a complex configuration and is upsized.

Meanwhile, in the technology described in the above Patent Document 2, no component is attached to the input portion of the inverter, and thus the power converting device can be set to have a simple configuration. However, the switching speeds of semiconductor switching elements of power converting devices have been progressively increased owing to improvement in the structures of semiconductors, usage of new materials for the semiconductors, and the like, and the increase in the switching speeds might lead to fluctuation of the voltage between main terminals of each semiconductor switching element due to a parasitic inductance component and a parasitic capacitance component of the power converting device. In the technology described in Patent Document 2, the upper-arm ON detection circuit and the lower-arm ON detection circuit may malfunction and transmit detection pulses a plurality of times. Consequently, a problem exists in that the accuracy of detecting a change time point of the output voltage of the power converting device deteriorates.

The present disclosure has been made to solve the above problems, and an object of the present disclosure is to attain a simple configuration, and furthermore, to suppress deterioration of the accuracy of detecting a change time point of the output voltage of a power converting device even if the switching speed of semiconductor switching elements is increased.

Means for Solving the Problems

A power converting device according to the present disclosure includes
- an upper-arm semiconductor switching element and a lower-arm semiconductor switching element connected in series between a positive-side input terminal and a negative-side input terminal;
- an upper-arm gate drive circuit configured to drive the upper-arm semiconductor switching element and including an upper-arm time point detection circuit configured to detect a time point at which a voltage between main terminals of the upper-arm semiconductor switching element has crossed a first reference voltage;
- a lower-arm gate drive circuit configured to drive the lower-arm semiconductor switching element and including a lower-arm time point detection circuit configured to detect a time point at which a voltage between main terminals of the lower-arm semiconductor switching element has crossed a second reference voltage; and a controller including
    a calculator configured to calculate a change time point of an output voltage outputted from a connection portion between the upper-arm semiconductor switching element and the lower-arm semiconductor switching element, and
    a PWM command pulse generator configured to generate, on the basis of information about the time point calculated by the calculator, a PWM command pulse to be given to the upper-arm gate drive circuit and the lower-arm gate drive circuit, wherein each of the upper-arm time point detection circuit and the lower-arm time point detection circuit includes
    a voltage division circuit configured to divide or reduce the voltage between the main terminals of the semiconductor switching element,
    a comparator configured to compare an output from the voltage division circuit with the corresponding one of the first reference voltage and the second reference voltage, and detect and output a time point at which the voltage between the main terminals of the semiconductor switching element has been changed, and
    a filter disposed between the voltage division circuit and the comparator and having a time constant smaller than a change time period of the voltage between the main terminals of the semiconductor switching element.

Effect of the Invention

In the power converting device according to the present disclosure, it is possible to simplify a configuration, and furthermore, to suppress deterioration of the accuracy of detecting a change time point of the output voltage of the power converting device even if the switching speed of a semiconductor switching element is increased.

EMBODIMENTS FOR CARRYING OUT THE INVENTION

Embodiment 1

Figure 1:
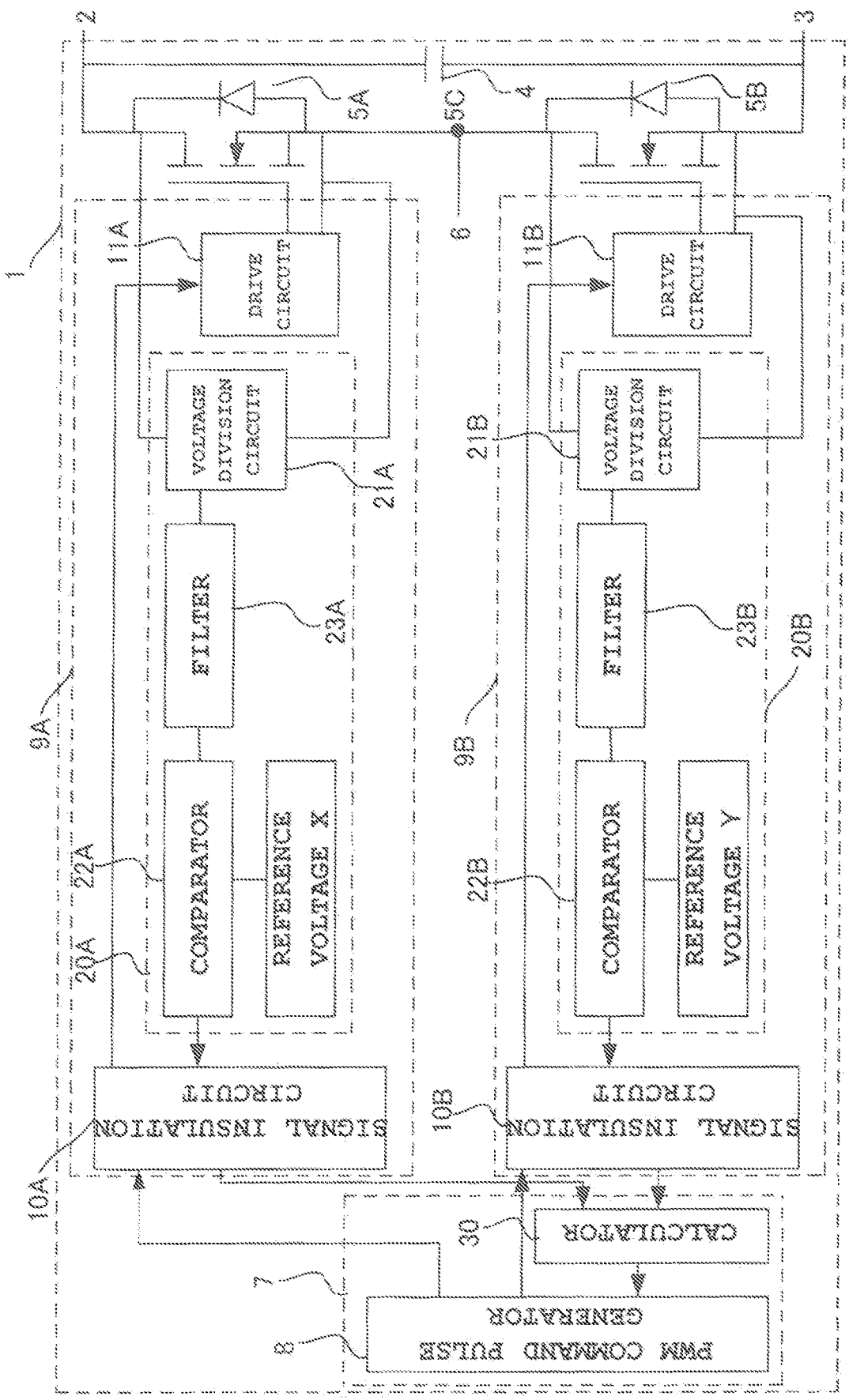
FIG. 1 is a configuration diagram showing a power converting device according to embodiment 1.
Figure 2:
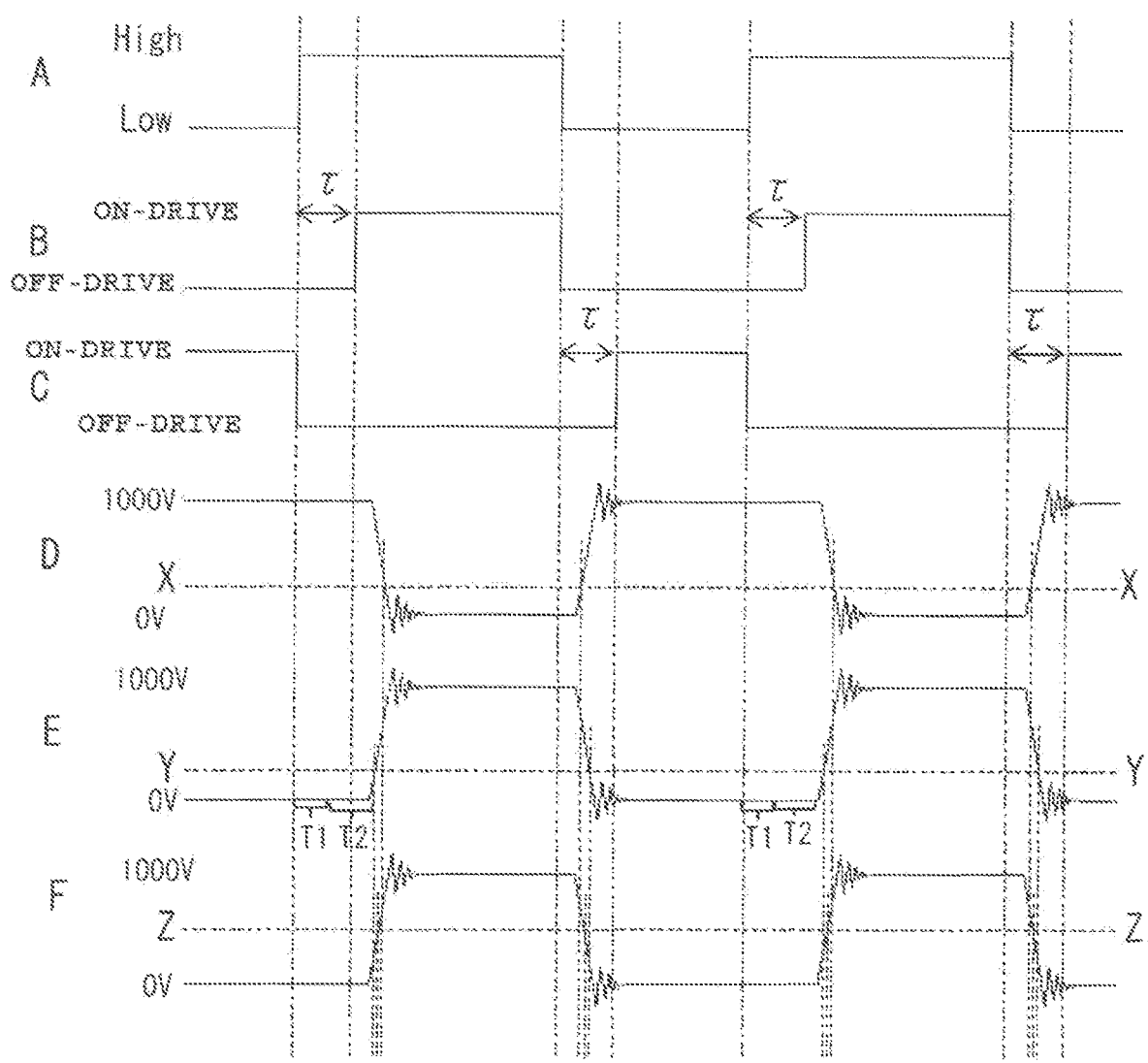
FIG. 2 is a time-series waveform diagram for explaining operation of the power converting device according to embodiment 1.

FIG. 1 is a configuration diagram showing a power converting device according to embodiment 1. FIG. 2 is a time-series waveform diagram for explaining operation of the power converting device according to embodiment 1. A power converting device 1 has a two-level inverter circuit. The input of the power converting device 1 is DC voltage, and the power converting device has two input portions which are a positive-side inverter input portion (positive-side input terminal) 2 and a negative-side inverter input portion (negative-side input terminal) 3. Description will be given below on the assumption of a case in which the potential of the positive-side inverter input portion 2 is 1000 V and the potential of the negative-side inverter input portion 3 is 0 V. A capacitor 4 is present between the positive-side inverter input portion 2 and the negative-side inverter input portion 3 and stores a DC voltage of 1000 V.

Further, an upper-arm semiconductor switching element 5A and a lower-arm semiconductor switching element 5B are connected in series between the positive-side inverter input portion 2 and the negative-side inverter input portion 3 so as to form an upper-arm circuit and a lower-arm circuit, respectively. As an output of the power converting device 1, an inverter output 6 is outputted from a connection portion 5C between the upper-arm semiconductor switching element 5A and the lower-arm semiconductor switching element 5B. It is noted that, for example, an induction electric motor (not shown in FIG. 1) is connected to a portion subsequent to the inverter output 6. In a case in which a three-phase induction electric motor is configured as the induction electric motor, the inverter circuit shown in FIG. 1 indicates an inverter circuit for one of the three phases, e.g., a U phase. And the same type of inverter circuit is provided in addition to this inverter circuit also to each of a V phase and a W phase, and these circuits are connected to stator windings of the three-phase induction electric motor. Alternatively, an electric motor other than the induction electric motor may be used.

When the upper-arm semiconductor switching element 5A is turned on, the potential of the inverter output 6 becomes equal to the potential of the positive-side inverter input portion 2. That is, the potential of the inverter output 6 becomes 1000 V. When the lower-arm semiconductor switching element 5B is turned on, the potential of the inverter output 6 becomes equal to the potential of the negative-side inverter input portion 3. That is, the potential of the inverter output 6 becomes 0 V. In this manner, the potential of the inverter output has two levels, i.e., a high level and a low level.

It is noted that, as each semiconductor switching element, a unipolar device such as a metal-oxide-semiconductor field-effect transistor (MOSFET) may be used, ox a bipolar device such as an insulated-gate bipolar transistor (IGBT) may be used. As a material of the semiconductor switching element, a widely-used silicon (Si) material may be used, or a wide-bandgap semiconductor material such as silicon carbide (Sic) may be used.

The switching speeds of semiconductor switching elements of power converting devices have been progressively increased owing to improvement in the structures of semiconductors, usage of new materials for the semiconductors, and the like. In bipolar devices such as insulated-gate bipolar transistors (IGBTs), a carrier disappearance time period is shortened, influence of a damping resistance component is relatively weakened, and influence of a parasitic capacitance component is relatively strengthened. In addition, at the time of switching with small current, the amount of accumulated carriers is small. Thus, while the influence of the damping resistance component is relatively weak, the influence of the parasitic capacitance component is relatively strong. In unipolar devices such as metal-oxide-semiconductor field-effect transistors (MOSFETs), wide-bandgap semiconductor materials are used, and thus semiconductor switching elements having a high voltage durability have been progressively put into practical use. In a unipolar device, in principle, influence of minority carriers is not inflicted, and, while influence of a damping resistance component is relatively weak, influence of a parasitic capacitance component is relatively strong. Therefore, the voltage between main terminals of each semiconductor switching element may oscillate at the time of switching owing to parasitic capacitance component of the semiconductor switching elements and parasitic inductance component on wires of the power converting device. In association with the oscillation, the potential of the output of the inverter also oscillates.

In FIG. 1, the power converting device 1 includes a controller 7. The controller 7 includes a PWM command pulse generator 8 which generates a pulse width modulation (PWM) command pulse. The PWM command pulse is a signal serving as a command as to a time point at which the level of the inverter output 6 should be changed from the high level to the low level, or a time point at which the level should be changed from the low level to the high level. An upper-arm gate drive circuit 9A receives the PWM command pulse via a signal insulation circuit 10A. The upper-arm gate drive circuit 9A includes a drive circuit 11A. In FIG. 2, "A" indicates the waveform of a PWM command pulse, "B" indicates an operation waveform of the upper-arm gate drive circuit, "C" indicates an operation waveform of the lower-arm gate drive circuit, "D" indicates the waveform of a voltage between main terminals of the upper-arm semiconductor switching element, "E" indicates the waveform of a voltage between main terminals of the lower-arm semiconductor switching element, and "F" indicates the voltage value of the output of the inverter.

As shown in FIG. 2, when the level of the PWM command pulse A is changed from the high level to the low level, the drive circuit 11A immediately applies a negative gate voltage to the gate of the upper-arm semiconductor switching element 5A so that the upper-arm semiconductor switching element 5A is driven to be turned off. When the level of the PWM command pulse is changed from the low level to the high level, the drive circuit 11A applies a positive gate voltage to the gate of the upper-arm semiconductor switching element 5A so that the semiconductor switching element 5A is driven to be turned on, after the elapse of a certain delay time period t.

A lower-arm gate drive circuit 9B also receives the PWM command pulse via a signal insulation circuit 108. The lower-arm gate drive circuit 9B also includes a drive circuit 11B. As shown in FIG. 2, when the level of the PWM command pulse is changed from the low level to the high level, the drive circuit 118 immediately applies the negative gate voltage to the gate of the lower-arm semiconductor switching element 5B so that the semiconductor switching element 5B is driven to be turned off. When the level of the PWM command pulse is changed from the high level to the low level, the drive circuit 11B applies the positive gate voltage to the gate of the lower-arm semiconductor switching element 5B so that the semiconductor switching element 58 is driven to be turned on, after the elapse of the certain delay time period 1.

Owing to the presence of the certain delay time period t, there are periods in which both the upper-arm semiconductor switching element 5A and the lower-arm semiconductor switching element 5B are driven to be turned off. Each of these periods t is called a dead time. Since the dead time is present, the upper-arm and lower-arm semiconductor switching elements of the inverter can be prevented from being simultaneously turned on. It is noted that, although a configuration in which the dead time is set by each gate drive circuit has been described above, a configuration in which the dead time is set by be controller 7 may be used. In the PWM command pulse from the controller 7, the dead times are set after a PWM command pulse is generated, so that a dead-time-set PWM command pulse for the upper-arm gate drive circuit 9A and a dead-time-set PWM command pulse for the lower-arm gate drive circuit 9B can be generated.

Further, there is a delay time period (T1+T2 in FIG. 2) from a time point at which the voltage of the gate of the semiconductor switching element is changed to a time point at which the voltage between the main terminals of the semiconductor switching element is changed. This delay time period means a delay time period taken until a diode is turned off by turning on the opposed arm (upper arm) while the given arm (lower arm) is in a backflow mode. Here, "T1" is a delay time period taken until the gate voltage is actually reduced, and "T2" is a delay time period taken until the diode is turned off by turning on the opposed arm.

The delay time period changes when a capacitor voltage, a temperature, or the like is changed. In this manner, a time point at which the level of the inverter output voltage is changed from the high level to the low level, and a time point at which the level is changed from the low level to the high level, differ from corresponding change time points of the PWM command pulse. A time width during which the inverter output voltage is kept at the high level, and a time width during which the inverter output voltage is kept at the low level, differ from corresponding time widths of the PWM command pulse. If these differences are large, problems might arise in that: irregularity in rotation of the induction electric motor occurs; or electromagnetic noise increases.

Considering this, in the power converting device according to embodiment 1, the upper-arm gate drive circuit 9A includes an upper-arm time point detection circuit 20A which detects a time point at which the voltage between the main terminals of the upper-arm semiconductor switching element 5A has crossed a reference voltage (first reference voltage). In FIG. 2, "X" indicates the reference voltage for the upper-arm time point detection circuit, "Y" indicates a reference voltage (second reference voltage) for a lower-arm time point detection circuit, and "z" indicates a voltage that is ½ of the DC input voltage of the inverter. In general, it is necessary that two voltage measurement points are provided in order to measure a voltage. In conventional technologies, one of the voltage measurement points is provided in an inverter output portion so as to be apart from a semiconductor switching element. Consequently, the voltage of the semiconductor switching element cannot be measured with high accuracy. Meanwhile, in the present embodiment, the two voltage measurement points are provided in the main terminals of each semiconductor switching element. Since the two voltage measurement points are provided near the semiconductor switching element, the voltage of the semiconductor switching element can be measured with high accuracy.

The magnitude of the reference voltage X is set to be equal to or larger than a gate drive voltage to be applied at the time of turning on the upper-arm semiconductor switching element 5A. A manufacturer of each semiconductor switching element sets a limitation value for the voltage capable of being applied to the gate of the semiconductor switching element. The limitation value is ±20 V in many cases. The corresponding gate drive circuit applies the positive/negative gate voltage to the gate of the semiconductor switching element, and the value of the voltage falls within the limitation value specified by the manufacturer of the semiconductor switching element. In many cases, the value of the gate drive voltage applied at the time of torn-on is +10 V to +18 V, and the value of the gate drive voltage at the time of turn-off is 0 v to −18 V.

A case in which the state of the upper-arm gate drive circuit 9A is switched from a state of being driven to be turned off to a state of being driven to be turned on, will be contemplated. As described above, the voltage between the main terminals of each semiconductor switching element might fluctuate at the time of switching. In the present embodiment, as shown in FIG. 2, the upper-arm time point detection circuit 20A can detect, before the voltage between the main terminals of the semiconductor switching element takes a value smaller than the gate drive voltage to be applied at the time of turn-on, a time point at which the voltage between the main terminals of the semiconductor switching element has crossed the reference voltage X. At this time point, the semiconductor switching element has not yet taken a complete ON state, and oscillation has not yet started. Thus, the upper-arm time point detection circuit 20A does not perform detection a plurality of times and does not malfunction. Therefore, even if the switching speed of the semiconductor switching element is increased, deterioration of the accuracy of detecting a change time point of the output voltage of the power converting device can be suppressed.

The upper-arm time point detection circuit 20A includes a voltage division circuit 21A configured by a passive component such as a resistor, a capacitor, or an inductor. The voltage division circuit 21A divides or reduces the voltage between the main terminals of the semiconductor switching element so as to convert the voltage into a relatively small voltage. Thus, a component having a small voltage durability can be used as a circuit component connected on a side subsequent to the voltage division circuit 21A. The voltage division circuit performs operations that are symmetric between the case in which the level of the voltage between the main terminals of the semiconductor switching element is changed from the high level to the low level and the case in which the level is changed from the low level to the high level. A resistor voltage division circuit is the simplest example of the voltage division circuit. Here, the resistor voltage division means a circuit that reduces the voltage by connecting a plurality of resistors in series. The "operations" indicate motions in the divided voltage, and the phrase "performs operations that are symmetric" means that a time constant at which the voltage increases and a time constant at which the voltage decreases are equal to each other.

In the above configuration, it is possible to suppress deterioration of the accuracy of detecting a change time point of the output voltage of the power converting device.

Here, a case in which the voltage division circuit is implemented by a semiconductor component such as a diode or a transistor, will be contemplated. Voltage division or voltage reduction can be performed also by a semiconductor component. However, in general, in operations of semiconductor components, an operation at the time of turn-on and an operation at the time of turn-off are asymmetric each other. Thus, the voltage division circuit performs operations that are asymmetric between the case in which the level of the voltage between the main terminals of the semiconductor switching element is changed from the high level to the low level and the case in which the level is changed from the low level to the high level. Therefore, the accuracy of detecting a change time point of the output voltage of the power converting device deteriorates.

The upper-arm time point detection circuit 20A further includes a comparator 22A, and a filter 23A (low-pass filter) disposed between the comparator 22A and the voltage division circuit 21A and having a time constant smaller than a change time period of the voltage between the main terminals of the semiconductor switching element. The comparator 22A receives an output from the voltage division circuit 21A, compares the output and the reference voltage X, and detects and outputs a time point at which the voltage between the main terminals of the upper-arm semiconductor switching element 5A has been changed. An output from the comparator 22A is inputted to the controller 7 via the signal insulation circuit 10A of the gate drive circuit.

A circuit dedicated to information about a time point may be prepared as the signal insulation circuit 10A. That is, a signal insulation circuit for transmission of only information about a time point is provided. Alternatively, a circuit for transmitting error information about the gate drive circuit to the controller 7 may be used as the signal insulation circuit, and information about a time point may be superimposed on the error information. That is, both the error information and the information about the time point are transmitted to the signal insulation circuit for error information transmission. If the circuit for transmitting error information about the gate drive circuit to the controller 7 is used, it is possible to prevent the signal insulation circuit from being upsized.

The filter 23A in the present embodiment is a low-pass filter, and thus, if a short pulse (a pulse having a high frequency) having a time width smaller than the change time period of the voltage between the main terminals of the semiconductor switching element is inputted to the filter 23A, the comparator 22A does not react to a high-frequency pulse. Meanwhile, if a short pulse (a pulse having a low frequency) having a time width not smaller than the change time period of the voltage between the main terminals of the semiconductor switching element is inputted to the filter 23A, the comparator 22A reacts to a high-level period (see FIG. 2). That is, even if a noise (having a high frequency) having a time width smaller than the change time period of the voltage between the main terminals of the semiconductor switching element is inputted to the filter 23A, the noise is removed by the filter 23A. Information that is lost by operation of the filter 23A is information about a pulse having a time width smaller than the change time period of the voltage between the main terminals of the semiconductor switching element. Meanwhile, information about a pulse having a time width not smaller than the change time period of the voltage between the main terminals of the semiconductor switching element remains, and thus deterioration of the accuracy of detecting a change time point of the output voltage of the power converting device 1 can be suppressed.

Although the configuration and the operation of the upper-arm gate drive circuit 9A have been described above, a configuration and operation of the lower-arm gate drive circuit 9B are also the same as those of the upper-arm gate drive circuit 9A. Specifically, the lower-arm gate drive circuit 9B includes a lower-arm time point detection circuit 20B, and the lower-arm time point detection circuit 20B includes a voltage division circuit 21B, a comparator 22B, and a filter 23B.

The controller 7 includes a calculator 30 which calculates a change time point of the inverter output voltage. The calculator 30 receives, from the upper-arm gate drive circuit 9A, information about the time point at which the voltage between the main terminals of the upper-arm semiconductor switching element 5A has crossed the reference voltage X. The calculator 30 further receives, from the lower-arm gate drive circuit 9B, information about the time point at which the voltage between the main terminals of the lower-arm semiconductor switching element 5B has crossed the reference voltage Y. The calculator 30 calculates a time point that is ½ of the difference between the two pieces of information about the time points. By calculating the time point that is ½ of the difference between the two pieces of information about the time points, an effective width of an output pulse from the inverter is ascertained. Then, the controller 7 identifies, on the basis of the result of the calculation, a change time point corresponding to the change time point of the inverter output voltage on the basis of the standard of the voltage Z which is ½ of the DC input voltage of the inverter. If a pulse width estimated on the control side and a pulse width having been actually outputted differ from each other, the difference causes a waveform distortion. In order to eliminate such a waveform distortion, it is effective to identify a time point at which the inverter output voltage has reached a value that is ½ of the DC input voltage. In this manner, the calculator 30 calculates a time point at which the inverter output voltage has been changed. By setting so that the reference voltage X and the reference voltage Y are equal to each other, in many cases, it is possible to identify the time point at which the inverter output voltage has reached a value that is ½ of the DC input voltage. But, if the absolute value of a temporal change rate dV/dt of the voltage between the main terminals when the semiconductor switching element is turned on and the said absolute value when the semiconductor switching element is turned off significantly differ from each other, the identification can be realized by adjusting the difference between the reference voltage X and the reference voltage Y.

The controller 7 includes the PWM command pulse generator 8. The PWM command pulse generator 8 receives information about the time point calculated by the calculator 30 and generates a PWM command pulse to be transmitted to each of the upper-arm gate drive circuit 9A and the lower-arm gate drive circuit 9B. The time point at which the level of the inverter output voltage is changed from the high level to the low level, and the time point at which the level is changed from the low level to the high level, differ from the corresponding change time points of the PWM command pulse. So a PWM command pulse is generated on the basis of the information about the time point calculated by the calculator 30 in order to compensate for the difference. Specifically, a pulse width is adjusted. More specifically, a pulse switching timing is adjusted to adjust the pulse width. For example, the time point at which the level is changed from the high level to the low level may be advanced, or the time point at which the level is changed from the low level to the high level may be delayed. Further both the advancement and the delay may be used. It is noted that there are PWM command pulse generating methods other than the above method.

In conventional technologies, components are attached to both an output portion of an inverter and an input portion of the inverter. Consequently, the power converting device has a complex configuration and is upsized. However, in the present embodiment, no component is attached to the input portion of the inverter, and thus the configuration of the power converting device can be simplified.

Embodiment 2

Figure 3:
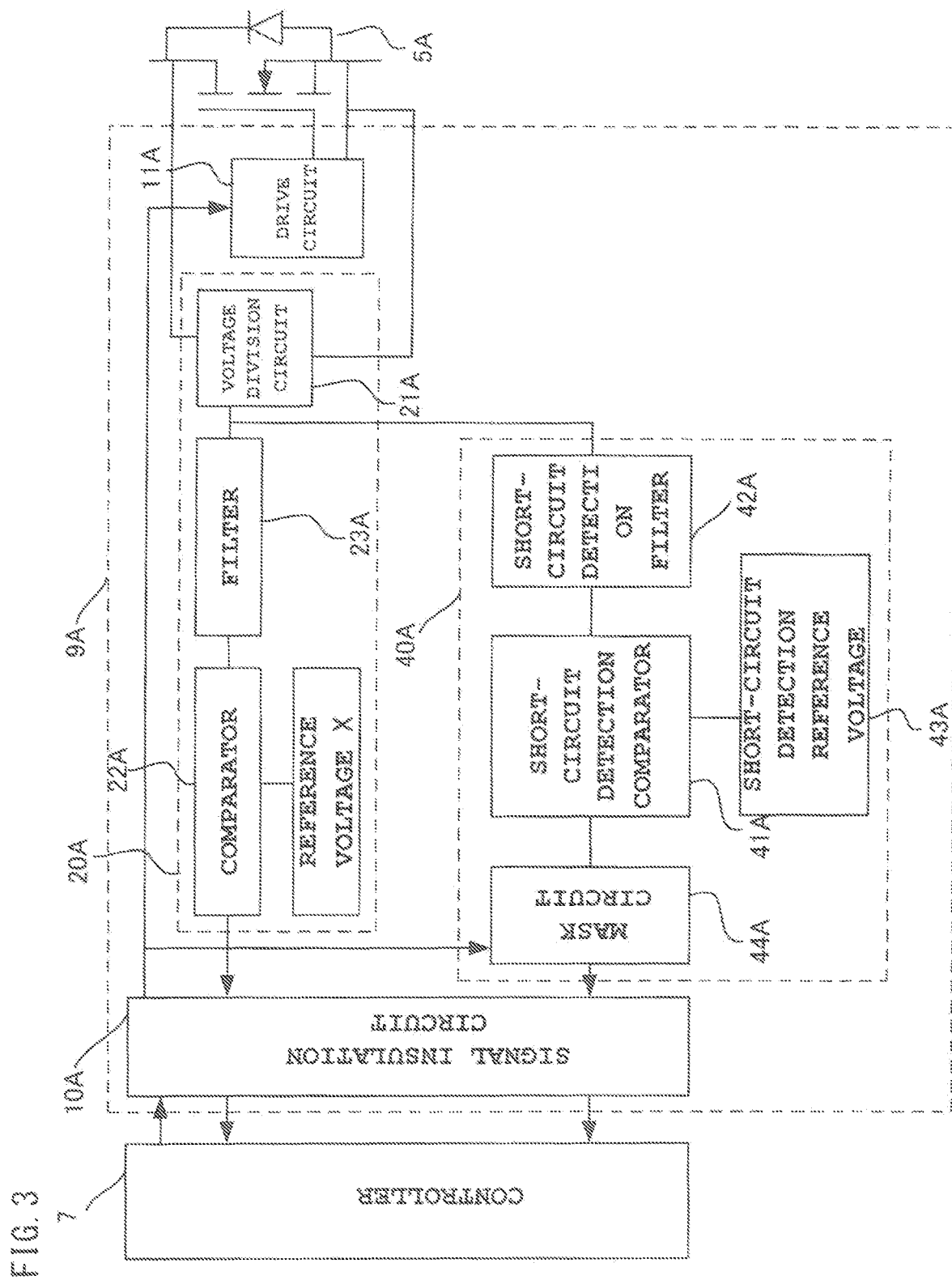
FIG. 3 is a configuration diagram showing a gate drive circuit of a power converting device according to embodiment 2.

FIG. 3 is a configuration diagram showing a gate drive circuit of a power converting device according to embodiment 2. The components other than the gate drive circuit are the same as those in embodiment 1, and descriptions thereof will be omitted. In addition, the upper-arm gate drive circuit 9A and the lower-arm gate drive circuit 9B have the same configuration, and the upper-arm gate drive circuit 9A will be described below. The configuration and the operation of the time point detection circuit of the gate drive circuit are the same as those in embodiment 1, and descriptions thereof will be omitted.

As a character of the present embodiment, the gate drive circuit includes a short-circuit detection circuit which performs detection as to whether or not a short-circuit fault of the semiconductor switching element has occurred. The short-circuit detection circuit shares components with the time point detection circuit, and these components are referred to as shared components. The shared components include at least the voltage division circuit.

A case in which the power converting device is normally operated, i.e., a case in which no short-circuit fault of the semiconductor switching element has occurred, will be contemplated. Here, the short-circuit fault of the semiconductor switching element means simultaneous electric conduction through the upper-arm semiconductor switching element 5A and the lower-arm semiconductor switching element 5B. In FIG. 3, when the upper-arm semiconductor switching element 5A is driven to be turned on by the upper-arm gate drive circuit 9A, the upper-arm semiconductor switching element 5A takes an ON state. Thus, the voltage between the main terminals of the upper-arm semiconductor switching element 5A becomes a relatively low voltage. On the other hand, a case in which a short-circuit fault of the semiconductor switching element has occurred will be contemplated. Although the upper-arm semiconductor switching element 5A is driven to be turned on by the upper-arm gate drive circuit 9A, a large short-circuit current flows through the upper-arm semiconductor switching element 5A. Thus, the voltage between the main terminals of the upper-arm semiconductor switching element 5A becomes a relatively high voltage.

The voltage division circuit 21A divides or reduces the voltage between the main terminals of the upper-arm semiconductor switching element 5A so as to convert the voltage into a relatively small voltage. Thus, if an upper-arm short-circuit detection circuit 40A shares the voltage division circuit 21A with the upper-arm time point detection circuit 20A and receives the output from the voltage division circuit 21A, the upper-arm short-circuit detection circuit 40A can obtain information about the voltage between the main terminals of the upper-arm semiconductor switching element 5A. In the configuration of the upper-arm short-circuit detection circuit 40A shown in FIG. 3, a short-circuit detection comparator 41A receives the output from the voltage division circuit 21A via a short-circuit detection filter 42A. A time constant of the short-circuit detection filter 42A has to be large so as to prevent occurrence of a malfunction in which occurrence of a short-circuit fault is detected despite the fact that no short-circuit fault has occurred. The time constant is often set to become a value not smaller than the change time period of the voltage between the main terminals of the semiconductor switching element.

Meanwhile, the time constant of the short-circuit detection filter 42A also has to be small such that occurrence of a short-circuit fault can be detected early. In this manner, the time constant of the short-circuit detection filter 42A is adjusted so as to be suitable for short-circuit detection. The short-Circuit detection comparator 41A has a short-circuit detection reference voltage 43A. As described above, the voltage between the main terminals of the semiconductor switching element becomes a relatively high voltage or a relatively low voltage depending on whether or not a short-circuit fault has occurred. The short-circuit detection reference voltage 43A is adjusted so as to enable determination as to whether or not a short-circuit fault has occurred.

Figure 4:
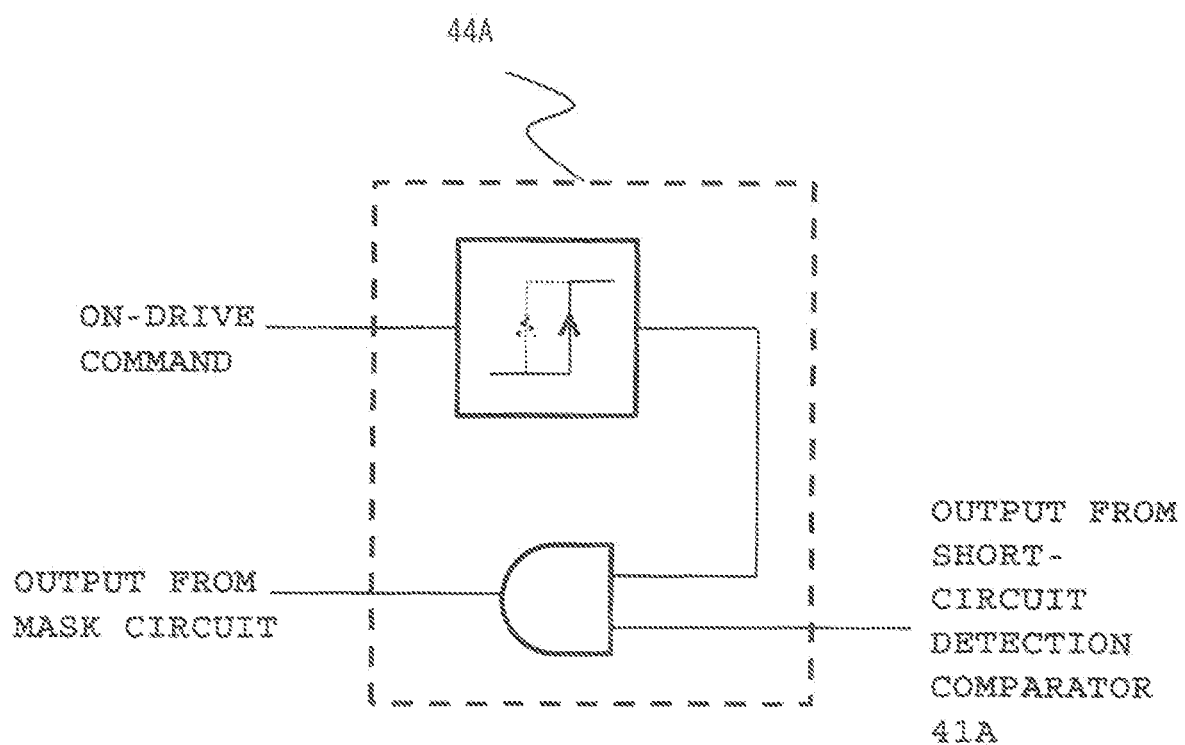
FIG. 4 is a configuration diagram showing a mask circuit in embodiment 2.

In the configuration of the upper-arm short-circuit detection circuit 40A shown in FIG. 3, the output from the short-circuit detection comparator 41A is transmitted to the controller 7 via a mask circuit 44A and the signal insulation circuit 10A of the upper-arm gate drive circuit 9A. FIG. 4 is a configuration diagram showing the mask circuit 44A. Here, the mask circuit is a circuit for preventing transmission of a signal. In the case of the present embodiment, the mask circuit is a circuit for preventing transmission of a short-circuit detection signal in the case in which no short-circuit has occurred.

When the semiconductor switching element is being driven to be turned off, the semiconductor switching element is in an OFF state. Even when the voltage between the main terminals of the semiconductor switching element has become a relatively high voltage, this relatively high voltage is not an abnormal voltage and does not mean that a short-circuit fault has occurred. Meanwhile, in an intermediate period during which the state of the semiconductor switching element is switched from a state of being driven to be turned off to a state of being driven to be turned on, the voltage between the main terminals of the semiconductor switching element is a relatively high voltage. This relatively high voltage is not an abnormal voltage and does not mean that a short-circuit fault has occurred. The mask circuit 44A receives information about the driven state of the semiconductor switching element and performs a masking operation such that the output from the short-circuit detection comparator 41A is not transmitted to the signal insulation circuit 10A in a situation in which no short-circuit fault has occurred.

In this manner, the upper-arm short-circuit detection circuit 40A can detect e of a short-circuit fault of the upper-arm semiconductor switching element 5A. If the controller 7 receives information about occurrence of the short-circuit fault from the upper-arm short-circuit detection circuit 40A, the controller 7 takes a countermeasure such as transmission of an OFF command to all the semiconductor switching elements in order to stop the flow of the short-circuit current. It is noted that the upper-arm short-circuit detection circuit 40A may directly transmit the information about occurrence of the short-circuit fault to the drive circuit 11A so that the upper-arm semiconductor switching element 5A is driven to be turned off by the drive circuit 11A.

Here, a case in which the time point detection circuit includes the voltage division circuit and the short-circuit detection circuit also includes a voltage division circuit for short-circuit detection, will be contemplated. Since the voltage between the main terminals of the semiconductor switching element is applied to the two voltage division circuits, it is necessary to provide insulation distance. Therefore, the distance between each voltage division circuit and the main terminals of the semiconductor switching element is elongated. Consequently, the time point detection circuit cannot measure the voltage of the semiconductor switching element by high accuracy. Meanwhile, the upper-arm gate drive circuit 9A configured as shown in FIG. 3 includes the upper-arm short-circuit detection circuit 40A which performs detection as to whether or not a short-circuit fault of the upper-arm semiconductor switching element 5A has occurred, the upper-arm short-circuit detection circuit 40A shares components with the upper-arm time point detection circuit 20A, and the shared components include the voltage division circuit 21A. Thus, the upper-arm gate drive circuit 9A can be downsized. In addition, the voltage division circuit 21A can be disposed near the main terminals of the upper-arm semiconductor switching element 5A. Therefore, occurrence of a short-circuit fault can be detected, and deterioration of the accuracy of detecting a change time point of the output voltage of the power converting device 1 can be suppressed.

Figure 5:
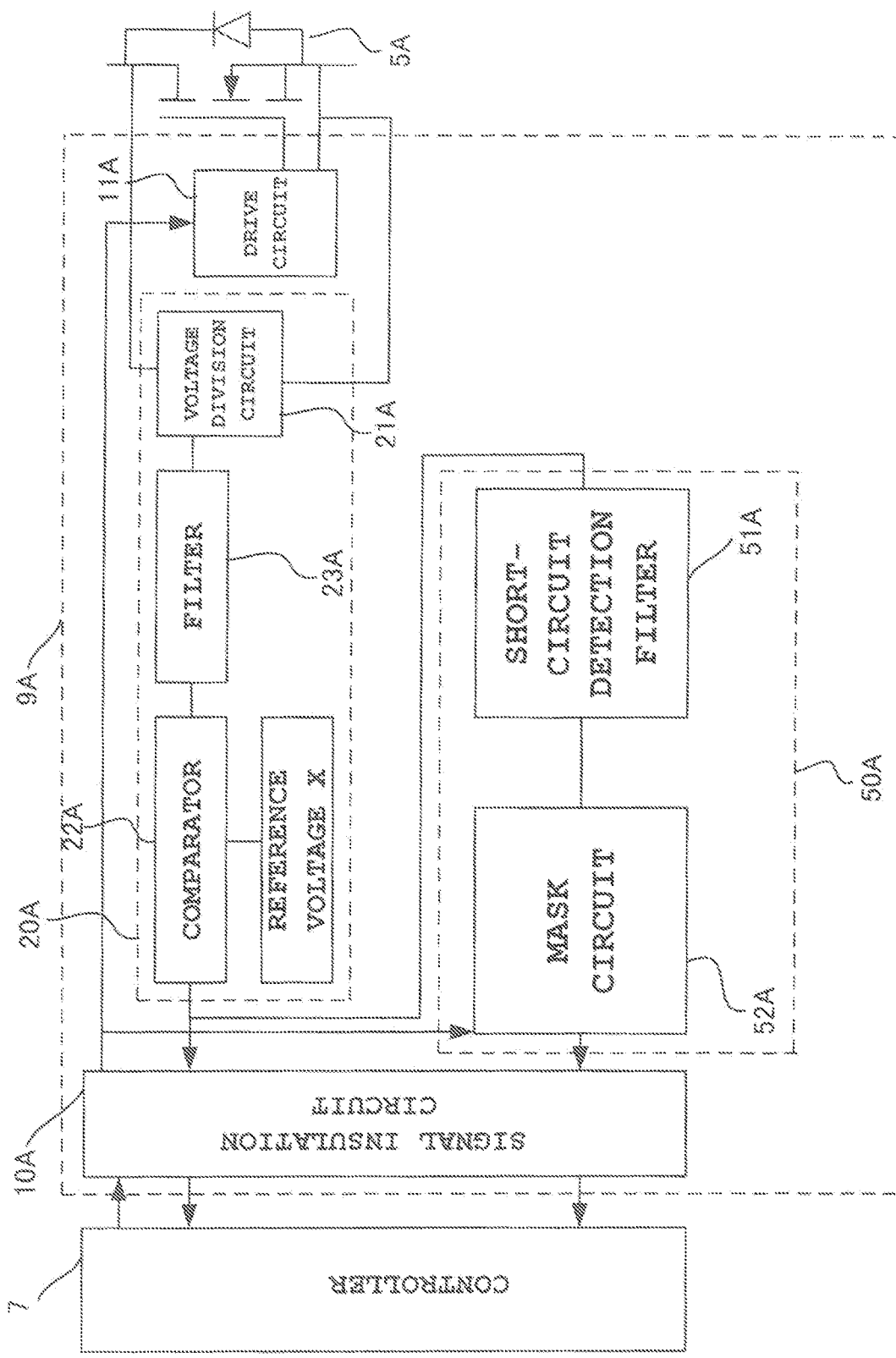
FIG. 5 is a configuration diagram showing a gate drive circuit of the power converting device according to embodiment 2.

FIG. 5 is a configuration diagram showing another gate drive circuit of the power converting device according to embodiment 2. The configuration and the operation of the upper-arm time point detection circuit 20A in the upper-arm gate drive circuit 9A are the same as those shown in FIG. 3, and descriptions thereof will be omitted. The difference from the gate drive circuit shown in FIG. 3 is that the voltage division circuit is not the only shared component. An upper-arm short-circuit detection circuit 50A in FIG. 5 shares, as shared components, the voltage division circuit 21A, the filter 23A, the comparator 22A, and the reference voltage X of the upper-arm time point detection circuit 20A. The upper-arm time point detection circuit 20A detects a time point at which the voltage between the main terminals of the upper-arm semiconductor switching element 5A has been changed. Thus, the short-circuit detection reference voltage value of the upper-arm short-circuit detection circuit 50A is used as the reference voltage value of the upper-arm time point detection circuit 20A, further the upper-arm time point detection circuit 20A can perform a detection operation. Therefore, the components can be shared as shown in the configuration shown in FIG. 5.

However, a short-circuit detection filter 51A of the upper-arm short-circuit detection circuit 50A has to be adjusted for short-circuit detection and cannot be used as a shared component. If the filter 23A, for the time point detection circuit, having a relatively small time constant is connected to a first stage and the short-circuit detection filter 51A having a relatively large time constant is disposed on a second stage, both the time point detection circuit and the short-circuit detection circuit can be realized. Accordingly, as shown in FIG. 5, the upper-arm short-circuit detection circuit 50A includes the short-circuit detection filter 51A and a mask circuit 52A. Further, the short-circuit detection filter 51A has a time constant not smaller than the change time period of the voltage between the main terminals of the semiconductor switching element 5A. The output from the comparator 22A of the upper-arm time point detection circuit 20A passes the signal insulation circuit 10A via the short-circuit detection filter 51A and the mask circuit 52A and is transmitted to the controller 7.

As described above, the upper-arm gate drive circuit 9A includes the short-circuit detection circuit 50A which detects occurrence of a short-circuit fault of the semiconductor switching element 5A. Further, the short-circuit detection circuit 50A receives the output from the comparator 22A via the short-circuit detection filter 51A having a time constant not smaller than the change time period of the voltage between the main terminals of the semiconductor switching element 5A.

In the configuration shown in FIG. 5, there are many shared components, and thus both the upper-arm time point detection circuit 20A and the upper-arm short-circuit detection circuit 50A can be disposed near the main terminals of the upper-arm semiconductor switching element 5A. Therefore, the upper-arm gate drive circuit 9A can be downsized.

In addition, occurrence of a short-circuit fault can be detected, and deterioration of the accuracy of detecting a change time point of the output voltage of the power converting device 1 can be suppressed.

Embodiment 3

Figure 6:
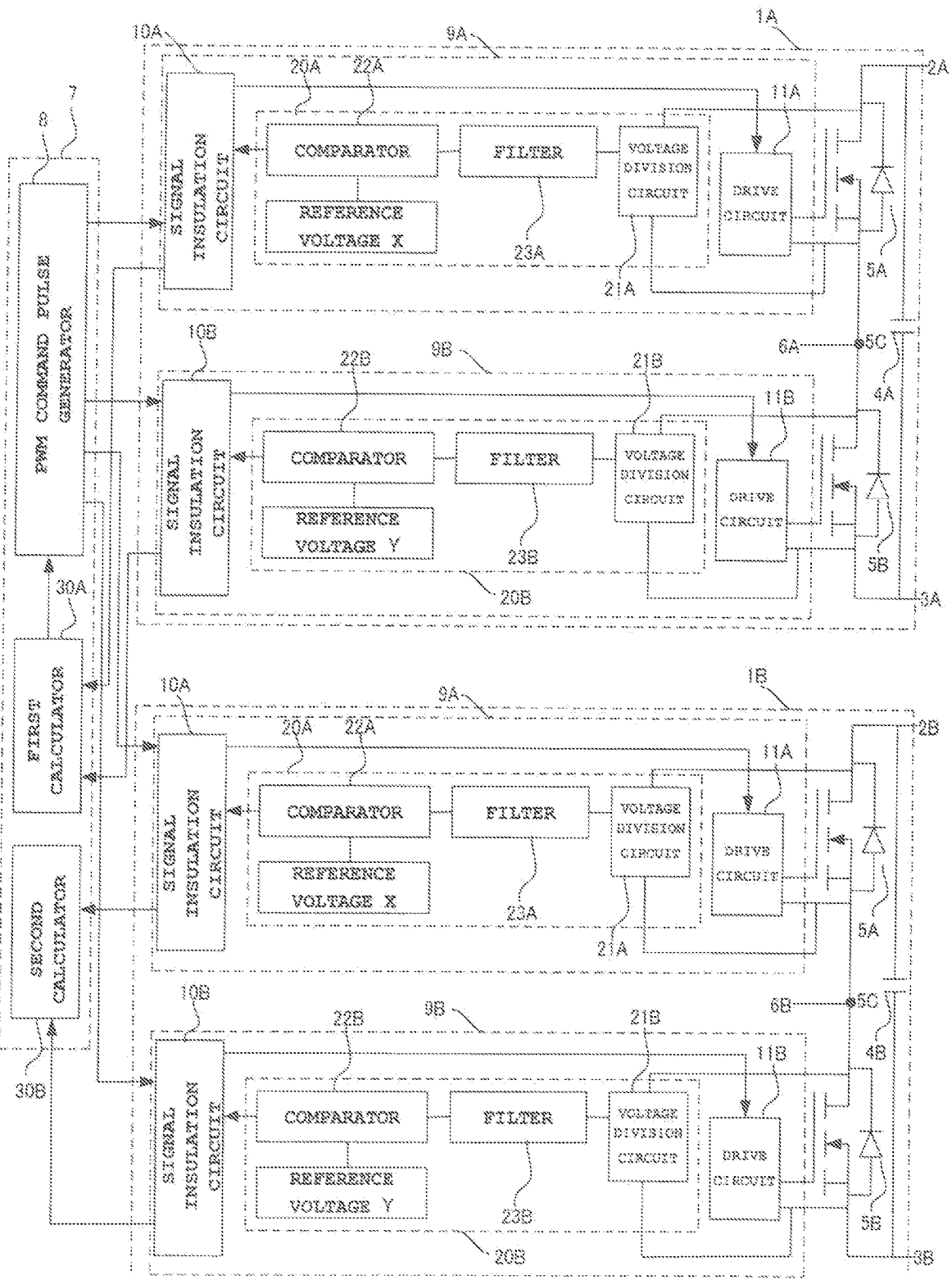
FIG. 6 is a configuration diagram showing a power converting device according to embodiment 3.

FIG. 6 is a configuration diagram showing a power converting device according to embodiment 3. In the present embodiment, a first power converting device 1A, a second power converting device 1B, and the controller 7 are provided. The configuration of each of the first power converting device 1A and the second power converting device 18 is the same as the configuration of the power converting device 1 described in embodiment 1, and thus descriptions thereof will be omitted.

A positive-side inverter input portion 2A of the first power converting device 1A and a positive-side inverter input portion 28 of the second power converting device 18 may be connected to each other, and a negative-side inverter input portion 3A of the first power converting device 1A and a negative-side inverter input portion 3B of the second power converting device 1B may be connected to each other. In this case, the DC voltage value of the input of the first power converting device 1A and the DC voltage value of the input of the second power converting device 18 are equal to each other. Further, a capacitor 4A between the two input portions in the first power converting device 1A may be shared with the second power converting device 18, and a capacitor 48 between the two input portions in the second power converting device 18 may be shared with the first power converting device 1A.

An inverter output 6A of the first power converting device 1A and an inverter output 6B of the second power converting device 18 can be connected to, for example, a double-three-phase induction electric motor.

The controller 7 includes: a first calculator 30A which calculates a time point at which an output voltage of the first power converting device 1A has been changed; and a second calculator 30B which calculates a time point at which an output voltage of the second power converting device 1B has been changed. The controller 7 includes the PWM command pulse generator 8 which receives information about the time points calculated by the first calculator 30A and the second calculator 308 and which generates PWM command pulses to be given to the first power converting device 1A and the second power converting device 18.

A time point at which the inverter output voltage of the first power converting device 1A is changed, and a time point at which the inverter output voltage of the second power converting device 18 is changed, differ from each other, and the PWM command pulse generator 8 generates the PWM pulses so as to compensate for the difference.

Therefore, a time point at which the level of the inverter output voltage of the first power converting device 1A is changed from the high level to the low level, and a time point at which the level of the inverter output voltage of the second power converting device 1B is changed from the high level to the low level, can be set so as to coincide with each other. Alternatively, a time point at which the level of the inverter output voltage of the first power converting device 1A is changed from the high level to the low level, and a time point at which the level of the inverter output voltage of the second power converting device 1B is changed from the low level to the high level, can also be set so as to coincide with each other. Thus, when the first power converting device 1A and the second power converting device 18 are provided, irregularity in rotation of the induction electric motor can be suppressed. Further, electromagnetic noise can be suppressed.

It is noted that, although a case in which two power converting devices, i.e., the first power converting device 1A and the second power converting device 18, are provided has been described above, three or more power converting devices may be provided.

In the above embodiments 1 to 3, it is possible to attain a simple configuration, and furthermore, it is possible to suppress deterioration of the accuracy of detecting a change time point of the output voltage of a power converting device even if the switching speed of semiconductor switching elements is increased.

As described in each of the above embodiments, the power converting device includes a controller and gate drive circuits which include detection circuits for detecting a time point at which the voltage of the semiconductor switching element has been changed. In the power converting device, a time point at which the inverter output voltage has been changed is detected by high accuracy, and a difference in the time point is corrected. Therefore, the present disclosure is useful for correcting a dead time or cooperative control of a plurality of inverters.

For example, there is a case in which, in a railway vehicle, a plurality of electric motors are used, and a large number of power converting devices for controlling the electric motors are also used. In such a case, it is required to attain uniformity in rotation among the plurality of electric motors by suppressing irregularities in rotation of the individual electric motors. The present disclosure satisfies this requirement.

In addition, the present disclosure is useful also in the case of assuming electrification of an aircraft. That is, the accuracy of detecting a change time point of the output voltage of the power converting device is improved, and thus each gate drive circuit can be downsized. Therefore, the weight of the entire device can be reduced. Further, occurrence of a short-circuit fault can also be detected, whereby improvement in reliability can also be expected. Likewise, on the assumption of a case in which the power converting device is used for an electrically-propelled ship or the like, the present disclosure is useful also in the case in which a plurality of propulsion motors are controlled in a coordinated way.

Although the disclosure is described above in terms of various exemplary embodiments and implementations, it should be understood that the various features, aspects, and functionality described in one or more of the individual embodiments are not limited in their applicability to the particular embodiment with which they are described, but they can be applied, alone or in various combinations to one or more of the embodiments of the disclosure.

It is therefore understood that numerous modifications which have not been exemplified can be devised without departing from the scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1, 1A, 1B power converting device
2 positive-side inverter input 3 negative-side inverter input
5A, 5B semiconductor switching element
7 controller
8 PWM command pulse generator
9A upper-arm gate drive circuit
9B lower-am gate drive circuit
20A upper-arm time point detection circuit
20B lower-arm time point detection circuit
21A, 21B voltage division circuit
22A, 228 comparator.
23A, 23B filter
30 calculator
40, 50 short-circuit detection circuit

The invention claimed is:

1. A power converter comprising:
an upper-arm semiconductor switching element and a lower-arm semiconductor switching element connected in series between a positive-side input terminal and a negative-side input terminal;
an upper-arm gate drive circuit configured to drive the upper-arm semiconductor switching element and including an upper-arm time point detection circuit configured to detect a time point at which a voltage between main terminals of the upper-arm semiconductor switching element has crossed a first reference voltage;
a lower-arm gate drive circuit configured to drive the lower-arm semiconductor switching element and including a lower-arm time point detection circuit configured to detect a time point at which a voltage between main terminals of the lower-arm semiconductor switching element has crossed a second reference voltage; and
a controller including
a calculator configured to calculate a change time point of an output voltage outputted from a connection portion between the upper-arm semiconductor switching element and the lower-arm semiconductor switching element, and
a PWM command pulse generator configured to generate, on the basis of information about the time point calculated by the calculator, a PWM command pulse to be given to the upper-arm gate drive circuit and the lower-arm gate drive circuit, wherein
each of the upper-arm time point detection circuit and the lower-arm time point detection circuit includes
a voltage division circuit configured to divide or reduce the voltage between the main terminals of the respective semiconductor switching element,
a comparator configured to compare an output from the voltage division circuit with the corresponding one of the first reference voltage and the second reference voltage, and detect and output a time point at which the voltage between the main terminals of the semiconductor switching element has been changed, and
a filter disposed between the voltage division circuit and the comparator and having a time constant smaller than a change time period of the voltage between the main terminals of the semiconductor switching element.

2. The power converter according to claim 1, wherein a magnitude of each of the first reference voltage and the second reference voltage is set to be equal to or larger than a gate drive voltage to be applied at a time of turning on the semiconductor switching element.

3. The power converter according to claim 2, wherein
each of the upper-arm gate drive circuit and the lower-arm gate drive circuit further includes a short-circuit detection circuit configured to detect occurrence of a short-circuit fault of the semiconductor switching element,
the short-circuit detection circuit shares components with the upper-arm time point detection circuit and the lower-arm time point detection circuit, and
the shared components include at least the voltage division circuit.

4. A power converting apparatus comprising
a plurality of power converters each of which is the power converter according to claim 3, wherein
the controller includes
a plurality of calculators configured to calculate time points at which output voltages of the plurality of respective power converters have been changed, and
a PWM command pulse generator configured to generate, on the basis of information about the time points calculated by the plurality of calculators, PWM command pulses to be given to the plurality of power converters.

5. The power converter according to claim 2, wherein
each of the upper-arm gate drive circuit and the lower-arm gate drive circuit further includes a short-circuit detection circuit configured to detect occurrence of a short-circuit fault of the semiconductor switching element, and
the short-circuit detection circuit receives an output from the comparator via a short-circuit detection filter having a time constant not smaller than the change time period of the voltage between the main terminals of the semiconductor switching element.

6. A power converting apparatus comprising
a plurality of power converters each of which is the power converter according to claim 5, wherein
the controller includes
a plurality of calculators configured to calculate time points at which output voltages of the plurality of respective power converters have been changed, and
a PWM command pulse generator configured to generate, on the basis of information about the time points calculated by the plurality of calculators, PWM command pulses to be given to the plurality of power converters.

7. A power converting apparatus comprising
a plurality of power converters each of which is the power converter according to claim 2, wherein
the controller includes
a plurality of calculators configured to calculate time points at which output voltages of the plurality of respective power converters have been changed, and
a PWM command pulse generator configured to generate, on the basis of information about the time points calculated by the plurality of calculators, PWM command pulses to be given to the plurality of power converters.

8. The power converter according to claim 1, wherein
each of the upper-arm gate drive circuit and the lower-arm gate drive circuit further includes a short-circuit detection circuit configured to detect occurrence of a short-circuit fault of the semiconductor switching element,
the short-circuit detection circuit shares components with the upper-arm time point detection circuit and the lower-arm time point detection circuit, and
the shared components include at least the voltage division circuit.

9. A power converting apparatus comprising
a plurality of power converters each of which is the power converter according to claim 8, wherein
the controller includes
- a plurality of calculators configured to calculate time points at which output voltages of the plurality of respective power converters have been changed, and
- a PWM command pulse generator configured to generate, on the basis of information about the time points calculated by the plurality of calculators, PWM command pulses to be given to the plurality of power converters.

10. The power converter according to claim 1, wherein
each of the upper-arm gate drive circuit and the lower-arm gate drive circuit further includes a short-circuit detection circuit configured to detect occurrence of a short-circuit fault of the semiconductor switching element, and
the short-circuit detection circuit receives an output from the comparator via a short-circuit detection filter having a time constant not smaller than the change time period of the voltage between the main terminals of the semiconductor switching element.

11. A power converting apparatus comprising
a plurality of power converters each of which is the power converter according to claim 10, wherein
the controller includes
- a plurality of calculators configured to calculate time points at which output voltages of the plurality of respective power converters have been changed, and
- a PWM command pulse generator configured to generate, on the basis of information about the time points calculated by the plurality of calculators, PWM command pulses to be given to the plurality of power converters.

12. A power converting apparatus comprising
a plurality of power converters each of which is the power converter according to claim 1, wherein
the controller includes
- a plurality of calculators configured to calculate time points at which output voltages of the plurality of respective power converters have been changed, and
- a PWM command pulse generator configured to generate, on the basis of information about the time points calculated by the plurality of calculators, PWM command pulses to be given to the plurality of power converters.

* * * * *